United States Patent
Couet et al.

(10) Patent No.: US 12,327,578 B2
(45) Date of Patent: Jun. 10, 2025

(54) MAGNETIC DOMAIN WALL-BASED MEMORY DEVICE WITH TRACK-CROSSING ARCHITECTURE

(71) Applicant: IMEC vzw, Leuven (BE)

(72) Inventors: Sebastien Couet, Grez-Doiceau (BE); Van Dai Nguyen, Wavre (BE); Gouri Sankar Kar, Leuven (BE); Siddharth Rao, Herent (BE); Jose Diogo Costa, Heverlee (BE)

(73) Assignee: IMEC vzw, Leuven (BE)

( * ) Notice: Subject to any disclaimer, the term of this patent is extended or adjusted under 35 U.S.C. 154(b) by 177 days.

(21) Appl. No.: 18/051,719

(22) Filed: Nov. 1, 2022

(65) Prior Publication Data
US 2023/0145983 A1    May 11, 2023

(30) Foreign Application Priority Data
Nov. 3, 2021   (EP) .................................. 21206136

(51) Int. Cl.
*G11C 11/16*  (2006.01)
*H10B 61/00*  (2023.01)
*H10N 50/10*  (2023.01)

(52) U.S. Cl.
CPC ........ *G11C 11/161* (2013.01); *G11C 11/1673* (2013.01); *G11C 11/1675* (2013.01); *H10B 61/00* (2023.02); *H10N 50/10* (2023.02)

(58) Field of Classification Search
CPC .............. G11C 11/161; G11C 11/1673; G11C 11/1675; H10B 61/00; H10N 50/10
See application file for complete search history.

(56) References Cited

U.S. PATENT DOCUMENTS

| 9,337,417 B2 * | 5/2016 | Gan .................... H01F 10/3286 |
| 2018/0090194 A1 | 3/2018 | Silva et al. |

(Continued)

FOREIGN PATENT DOCUMENTS

| KR | 2017001739 A | * | 1/2017 | ............. G11C 11/15 |
| TW | 201106353 A | * | 2/2011 | ......... G06F 17/5068 |

OTHER PUBLICATIONS

Annunziata et al., "Racetrack Memory Cell Array with Integrated Magnetic Tunnel Junction Readout," 2011 International Electron Devices Meeting, pp. 24.3.1-24.3.4.
Grimaldi et al., "Single-shot dynamics of spin-orbit torque and spin transfer torque switching in three-terminal magnetic tunnel junctions," Nature Nanotechnology, vol. 15, Feb. 2020, pp. 111-117.

(Continued)

*Primary Examiner* — Mushfique Siddique
(74) *Attorney, Agent, or Firm* — Knobbe, Martens, Olson & Bear, LLP

(57) ABSTRACT

The disclosed technology relates to a magnetic domain wall-based memory device including a combination of at least one magnetic domain wall track and at least one spin orbit torque (SOT) track, which are arranged in a crossing architecture. The SOT track can include a first strip of a patterned SOT generating layer, wherein the first strip extends into a first direction and is configured to pass a first current along the first direction. The magnetic domain wall track can include a second strip of the patterned SOT generating layer and a first magnetic strip of a patterned magnetic free layer, wherein the second strip extends along a second direction and intersects with the first strip in a first crossing region. The first magnetic strip can be provided on the second strip including the first crossing region and can be configured to pass a second current along the second direction. Further, a first and a second MTJ structure can be provided on the first magnetic strip and can be separated in the second direction. The first MTJ structure can be provided (Continued)

above the first crossing region and can be provided with a first voltage gate.

20 Claims, 6 Drawing Sheets

(56) References Cited

U.S. PATENT DOCUMENTS

| | | | |
|---|---|---|---|
| 2018/0130510 A1* | 5/2018 | Vaysset | G11C 11/16 |
| 2020/0242462 A1 | 7/2020 | Friedman et al. | |
| 2020/0294565 A1 | 9/2020 | Apalkov et al. | |
| 2020/0402558 A1* | 12/2020 | Phung | H10N 52/00 |
| 2021/0104344 A1* | 4/2021 | Nguyen | G01R 33/093 |
| 2021/0125652 A1 | 4/2021 | Honda et al. | |
| 2021/0125653 A1* | 4/2021 | Sonobe | H10N 52/00 |

OTHER PUBLICATIONS

Jiang et al., "Electric field control of spin-orbit torque switching in a spin-orbit ferromagnet single layer," Research Square, Dec. 14, 2020, pp. 1-18.
Raymenants et al., "All-electrical control of scaled spin logic devices based on domain wall motion," 2020 IEEE International Electron Devices Meeting (IEDM), pp. 21.5.1-21.5.4.
Thomas et al., "Racetrack Memory: a high-performance, low-cost, non-volatile memory based on magnetic domain walls," 2011 International Electron Devices Meeting, pp. 24.2.1-24.2.4.
Wu et al., "Voltage-Gate Assisted Spin-Orbit Torque Magnetic Random Access Memory for High-Density and Low-Power Embedded Application," Phys. Rev. Applied 15, 064015, 2021, pp. 1-10.
Extended European Search Report dated Apr. 28, 2022 in European Application No. 21206136.0 in 6 pages.

* cited by examiner

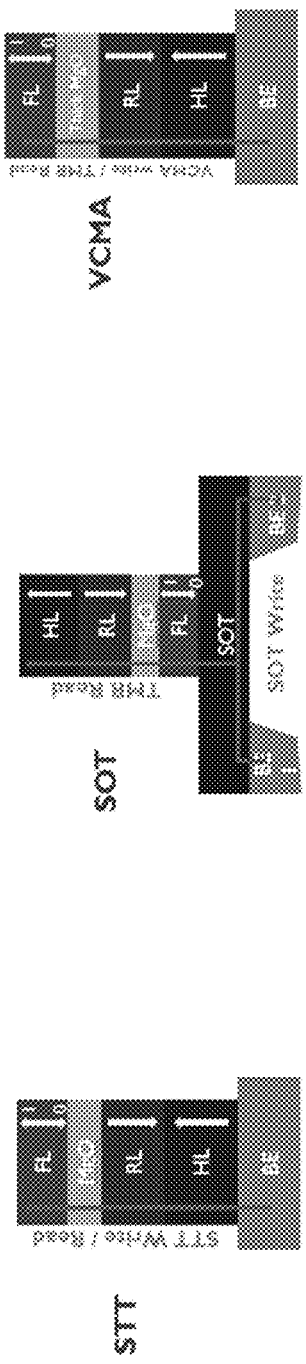
FIG. 1A-1 prior art
FIG. 1A-2 prior art
FIG. 1A-3 prior art
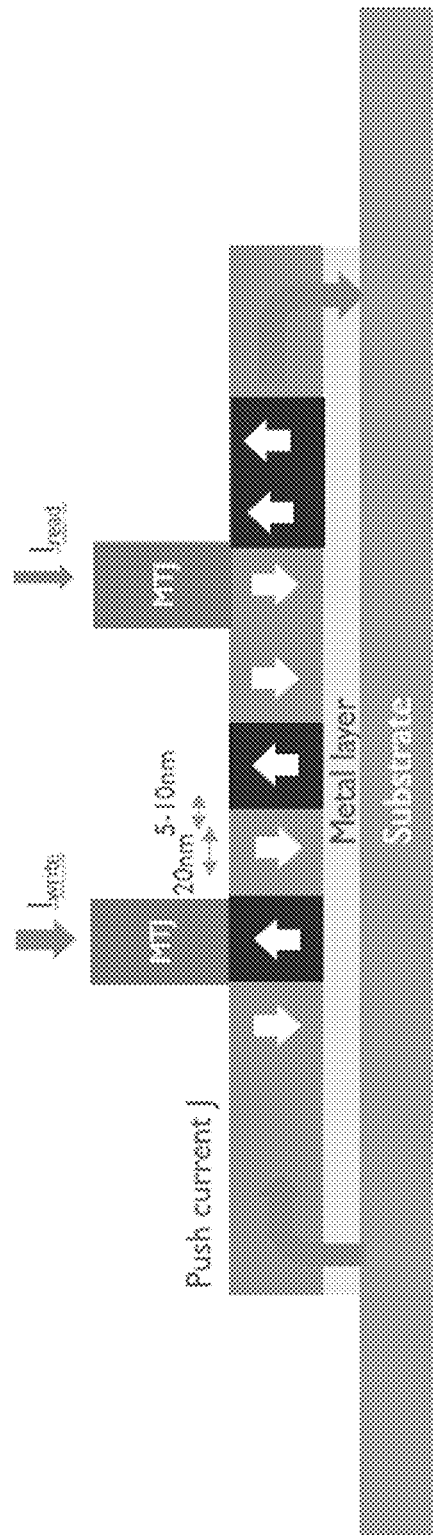
FIG. 1B prior art

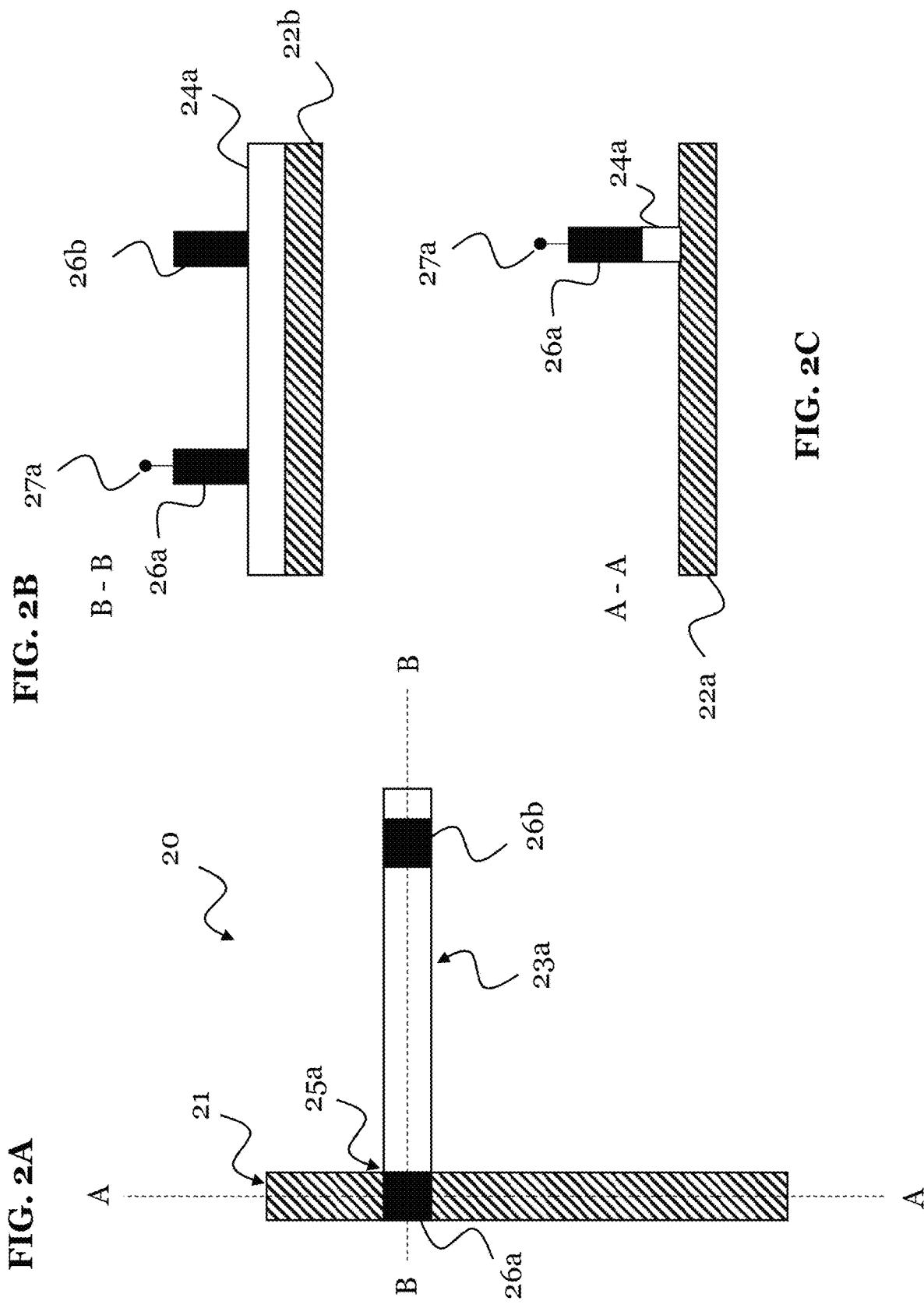

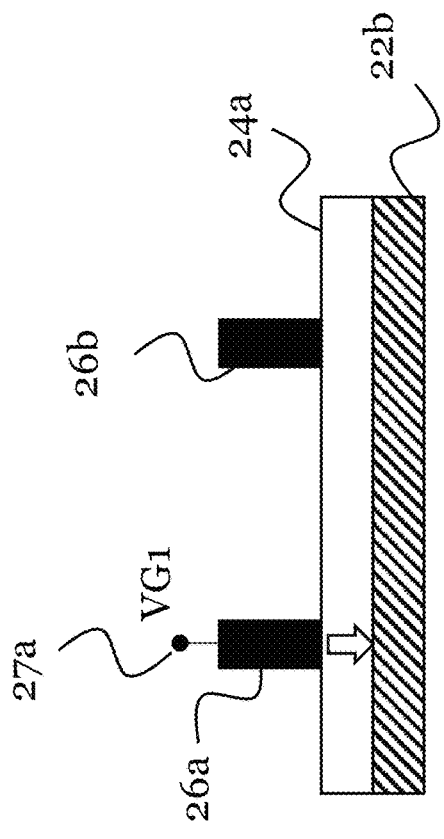
FIG. 3A
FIG. 3B
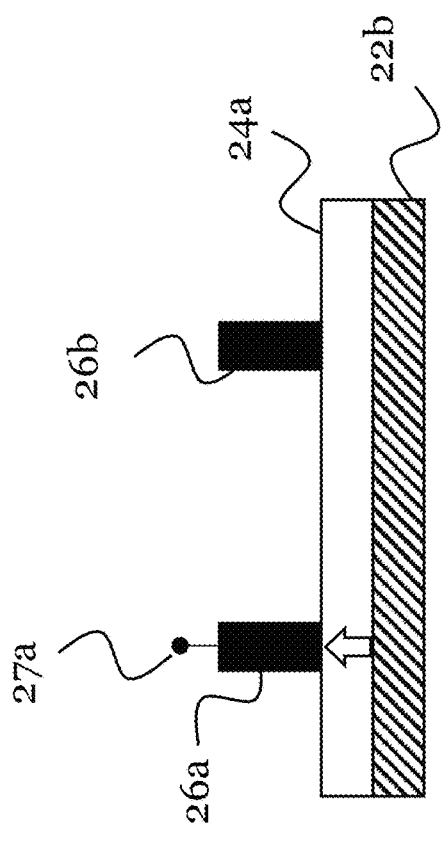
FIG. 3C
FIG. 3D

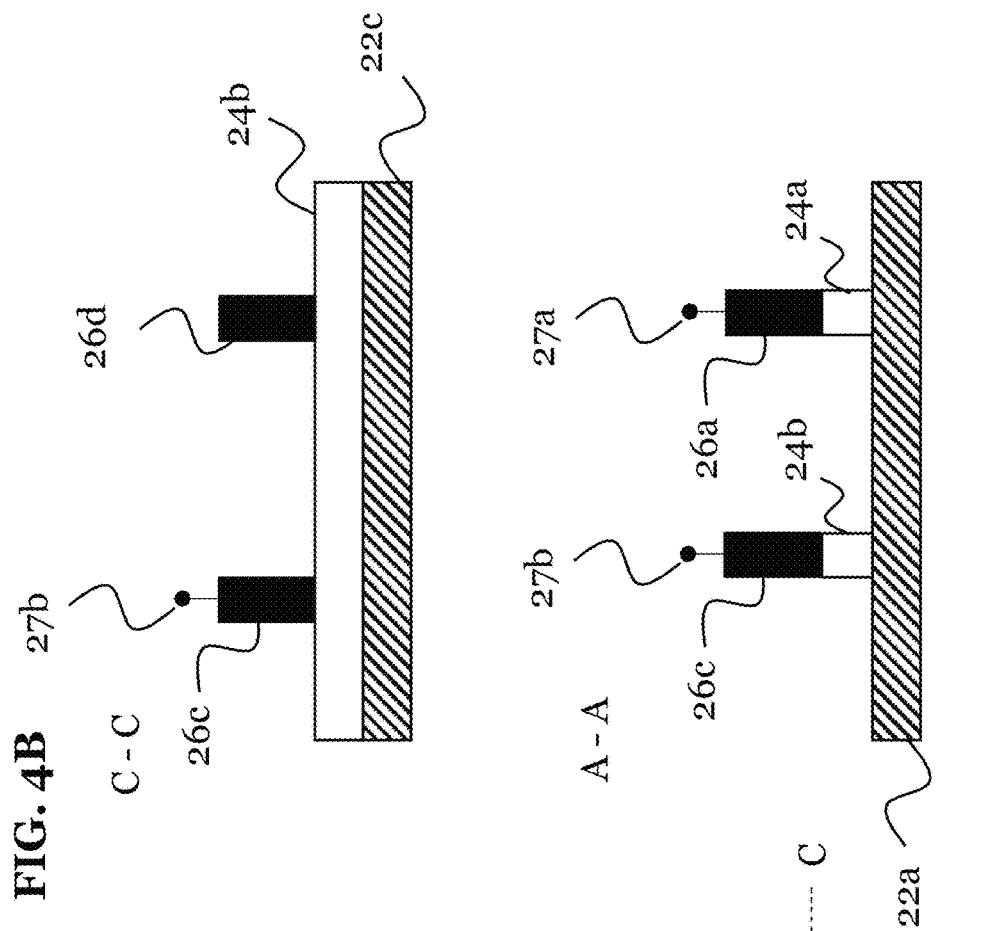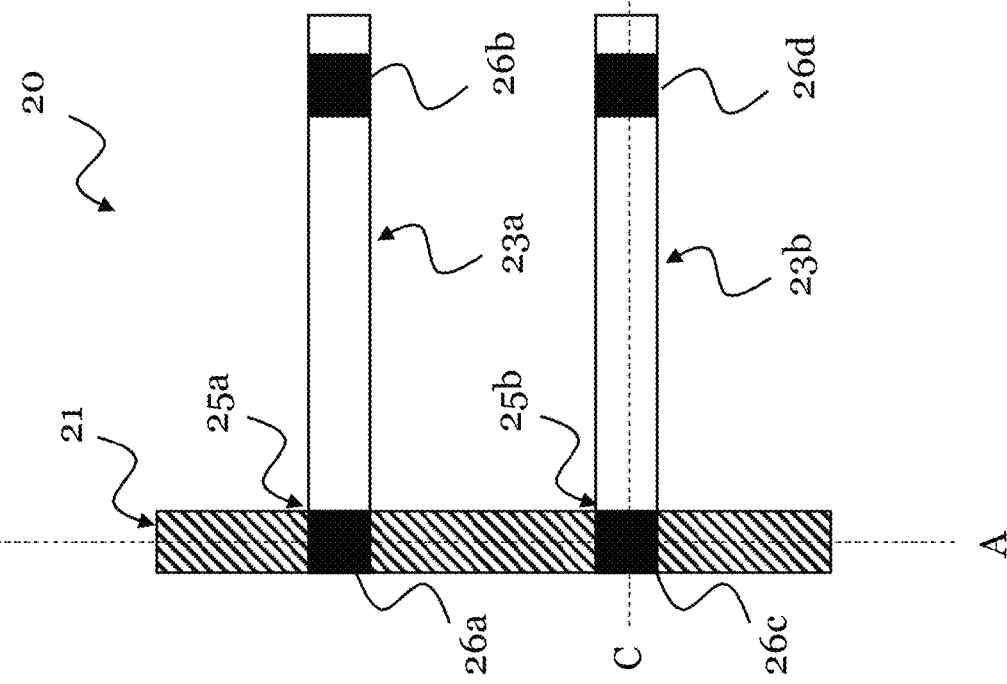

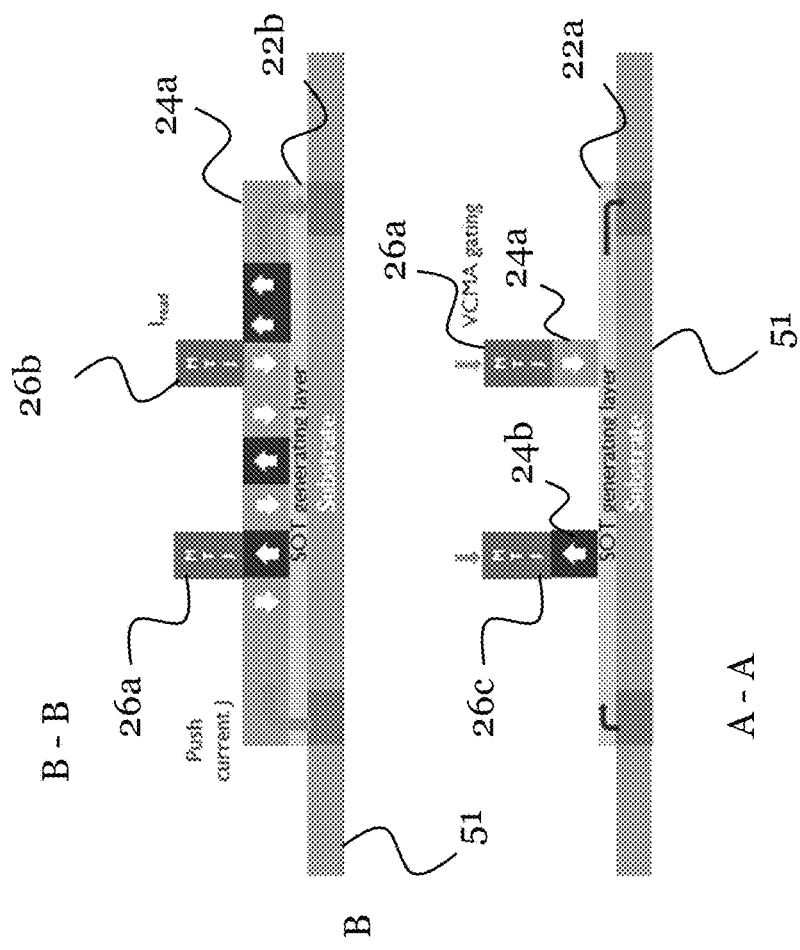
FIG. 5A
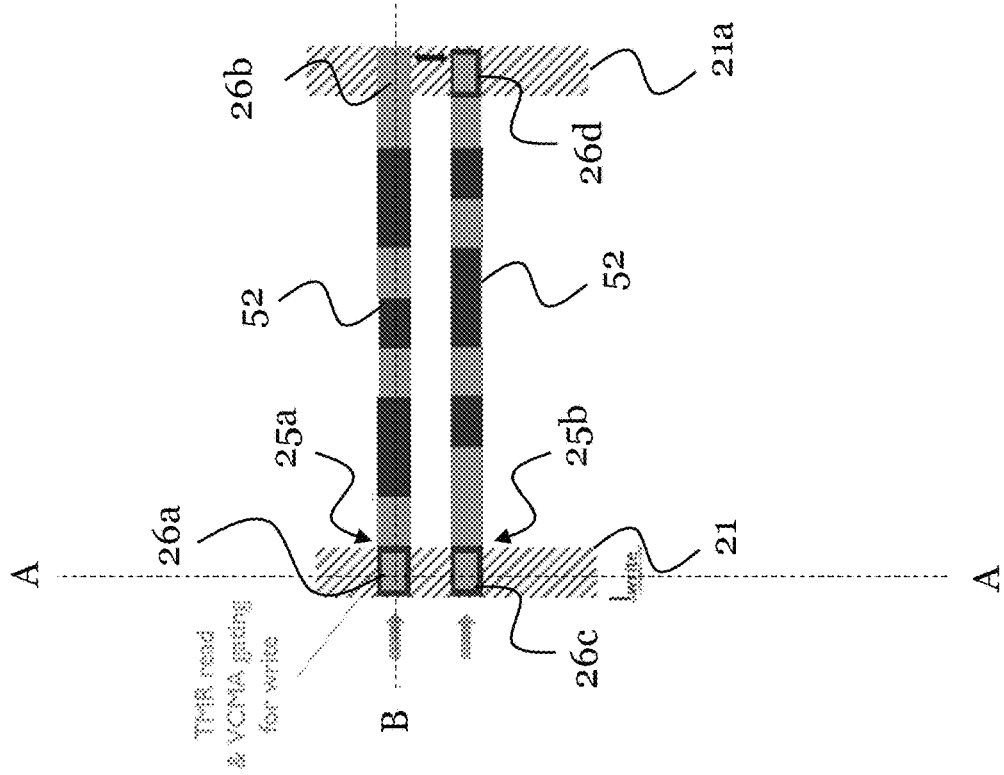
FIG. 5B
FIG. 5C

MAGNETIC DOMAIN WALL-BASED MEMORY DEVICE WITH TRACK-CROSSING ARCHITECTURE

CROSS-REFERENCE TO RELATED APPLICATIONS

This application claims foreign priority to European Patent Application No. EP 21206136.0, filed Nov. 3, 2021, the content of which is incorporated by reference herein in its entirety.

BACKGROUND

Technical Field

The disclosed technology is generally related to magnetic domain wall-based memory devices. The memory devices can be based on a combination of at least one magnetic domain wall track and at least one spin orbit torque (SOT) track. The memory devices can be based on a track-crossing architecture, e.g., the magnetic domain wall track can cross the SOT track. The memory device may be a magnetic random access memory (MRAM) device.

Description of the Related Technology

In a magnetic random access memory (MRAM) device based on the use of a perpendicular magnetic tunnel junction (MTJ) structure, a bit state can be encoded in magnetic orientation of a free layer sitting below (or above) the MTJ structure. The MTJ structure typically comprises a tunnel layer provided on the free layer, a magnetic reference layer and/or magnetic hard layer provided on the tunnel layer, and may comprise an electrode provided on the magnetic reference layer or the magnetic hard layer (see, e.g., FIG. 1A-1).

MRAM devices can use a spin transfer torque (STT) switching mechanism. In such MRAM devices, a STT current can be sent through the MTJ structure, in order to induce the switching of the magnetization in the free layer, which can be arranged adjacent to the MTJ structure, so as to write a bit state to the free layer. Likewise, the bit state may be read from the free layer. An application area of such STT-MRAM devices can be mostly within the embedded non-volatile memory market, due to their high switching speeds (e.g., ~5-100 ns), good retention, and good endurance.

MRAM devices may use alternative writing mechanisms, for example, a spin-orbit-torque (SOT) switching mechanism or a voltage controlled magnetic anisotropy (VCMA) switching mechanism. For SOT-MRAM devices, a current injection can be performed in-plane in an SOT generating layer, which is arranged adjacent to the free layer, and the switching of the magnetization in the free layer can be caused by the transfer of orbital angular momentum from electrons of the SOT generating layer to the magnetic free layer. For VCMA-MRAM devices, a voltage can be used to perform the write operation of the bit state. In particular, to switch the magnetization in the free layer, an electric field can be applied across the tunnel barrier of the MTJ (e.g., by the voltage) to remove the energy barrier, and in addition an external in-plane magnetic field can be applied for effecting the actual switching of the magnetization.

Examples of the above-described MRAM devices are illustrated in FIGS. 1A-1, 1A-2, and 1A-3 (STT-MRAM in FIG. 1A-1, SOT-MRAM in FIG. 1A-2, and VCMA-MRAM in FIG. 1A-3).

Another class of MRAM devices may combine the latter two switching mechanisms in a VCMA-gated SOT (VG-SOT) device. The VG-SOT MRAM devices can promise higher speeds (e.g., <ns) and lower power consumption.

Another type of magnetic devices can employ magnetic domain wall motion to encode and transport information. For example, magnetic domain wall-based memory devices can rely on a magnetic domain wall track, through which a current can be sent to push magnetic domains. The writing operation can be done using the STT switching mechanism described above and employing MTJ structures placed at different locations along the magnetic domain wall track (see FIG. 1B). The illustrated device layout implies that magnetic domains are moved along the magnetic domain wall track when the current is applied into the plane of the free layer, which is arranged beneath the MTJ structures. The STT current can be used to write a magnetic bit into the free layer, where the magnetization in the free layer below the MTJ structure may be switched (or not). The transported magnetic bit state can be read by using the tunnel magnetoresistance (TMR) effect at another MTJ structure.

A disadvantage of the magnetic domain wall-based memory device shown in FIG. 1B can be the use of the STT switching mechanism, which can be, however, an efficient switching mechanism. In particular, the STT writing can require a large STT current to be passed through the usually thin tunnel layer of the MTJ structure (which may, e.g., be an MgO dielectric tunnel barrier). This can create significant stress to the tunnel layer, and may thus reduce the endurance of the memory device as a whole. Moreover, the free layer, which can be in contact with the tunnel layer (e.g., the free layer may be a CoFeB in contact with the MgO layer) can be the layer that receives the spin torque, which can limit the switchability of more advanced magnetic tracks having several magnetic layers or more exotic materials like ferrimagnets. The switching speeds can also be limited to about 10-100 ns, thereby also limiting the overall speed of the memory device.

SUMMARY OF CERTAIN INVENTIVE ASPECTS

In view of the above, the disclosed technology has an objective to provide improved magnetic domain wall-based memory devices, e.g., memory devices having improved reliability, higher writing speed, and lower power consumption. Another goal includes better support of the use of magnetic materials, which can be suitable for high-speed domain wall transport.

These and other objectives can be achieved by various embodiments provided in the enclosed independent claims. Advantageous implementations of these embodiments are defined in the dependent claims.

A first aspect of the disclosed technology can provide a magnetic domain wall-based memory device comprising: a SOT track comprising a first strip of a patterned SOT generating layer, wherein the first strip extends into a first direction and is configured to pass a first current along the first direction; a first magnetic domain wall track comprising a second strip of the patterned SOT generating layer and a first magnetic strip of a patterned magnetic free layer, wherein the second strip extends along a second direction and intersects with the first strip in a first crossing region, and the first magnetic strip is provided on the second strip including the first crossing region and is configured to pass a second current along the second direction; a first and a second MTJ structure provided on the first magnetic strip and separated in the second direction, wherein the first MTJ structure is provided above the first crossing region and is provided with a first voltage gate.

A memory device of the first aspect can enable the writing of a bit state by a VG-SOT switching mechanism. In various implementations, current injection of the first current can be performed in-plane of the SOT generating layer, which can be arranged adjacent to the magnetic free layer in the first crossing region. Writing in this way may use significantly less power than writing with STT. Since no STT current is required, the reliability of the memory device can be improved due to less stress. Also the writing speed of the memory device of the first aspect can be higher. The switching of the magnetization in the free layer above the first crossing region (or not) may depend on the gate voltage that is applied to the first voltage gate. Thus, the desired bit state information can be written into the memory device using the combination of the SOT track and the VG-SOT mechanism. The written bit state information can then be transported along the magnetic domain wall track by domain wall transport.

In an implementation, the memory device can be configured such that when the first current flows in the first strip, a magnetization of the first magnetic strip between the first crossing region and the first MTJ structure switches, if a first gate voltage is applied to the first voltage gate, and does not switch, if a second gate voltage is applied to the first voltage gate.

In this way, the bit state (magnetization) beneath the MTJ structure in the first magnetic strip of the free layer can be written by VG-SOT, which can use only little power.

In an implementation, the memory device can be configured such that when the second current flows in the first magnetic strip, a magnetization of the first magnetic strip between the first crossing region and the first MTJ structure is transported by domain wall motion along the second direction towards the second MTJ structure.

In this way, the bit state that was written by applying the gate voltage to the first voltage gate can be transported by domain wall motion along the first magnetic domain wall track. The first magnetic domain wall track may be a first magnetic race track.

In an implementation, the memory device can further comprise a second magnetic domain wall track comprising a third strip of the patterned SOT generating layer and a second magnetic strip of the patterned magnetic free layer, wherein the third strip extends along the second direction parallel to the second strip and intersects with the first strip in a second crossing region, and the second magnetic strip is provided on the third strip including the second crossing region and is configured to pass a third current along the second direction; and a third and a fourth MTJ structure provided on the second magnetic strip and separated in the second direction, wherein the third MTJ structure is provided above the second crossing region and is provided with a second voltage gate.

In this way, two separate bit states can be written using the same SOT track, wherein the two bit states can be written beneath the respective MTJ structures (e.g., above the first and second crossing regions, respectively) in the first magnetic strip and the second magnetic of the free layer by using the VG-SOT switching mechanism.

In an implementation, the memory device can be configured such that when the first current flows in the first strip, a magnetization of the second magnetic strip between the second crossing region and the third MTJ structure switches, if a third gate voltage is applied to the second voltage gate, and does not switch, if a fourth gate voltage is applied to the second voltage gate.

In this way, the gate voltages applied to respectively the first voltage gate and the second voltage gate can be used to write desired bit state information into the free layer beneath the first and the third MTJ structure.

In an implementation, the memory device can be configured such that when the third current flows in the second magnetic strip, a magnetization of the second magnetic strip between the second crossing region and the third MTJ structure is transported by domain wall motion along the second direction towards the fourth MTJ structure.

In this way, the bit state information written by applying the gate voltages to the first voltage gate and the second voltage gate, respectively, can be transported by domain wall transport along the respective first and second domain wall track. The second domain wall track may be a magnetic race track.

In an implementation, the patterned SOT generating layer can comprise at least one of a tantalum layer; tungsten layer, platinum layer, bismuth selenide layer, and bismuth antimonide layer; and/or the patterned magnetic free layer can comprise at least one of an iron layer and a cobalt-based layer, for example, a cobalt layer, a cobalt-iron-boron layer, a cobalt-platinum layer, a cobalt-nickel layer, or a cobalt-palladium layer.

Generally, the disclosed technology is not limited to the material and/or the type of the magnetic free layer. Generally, for example, a perpendicular magnetized magnetic material may be used for the magnetic free layer, wherein some examples can be provided in this implementation. The magnetic free layer may be patterned into the respective strips of magnetic free layer by conventional techniques. Also the SOT generating layer may be patterned into the first strip by conventional techniques.

In an implementation, each MTJ structure can comprise a tunnel layer, for example, a magnesium oxide layer, which is provided on the patterned magnetic free layer, and at least one magnetic reference layer or magnetic hard layer provided on the tunnel layer.

Further, the MTJ structure may comprise a gate structure and/or a gate electrode provided on the magnetic reference layer or magnetic hard layer, e.g., in order to realize a voltage gate to apply a voltage to effect VG-SOT switching mechanism.

In an implementation, the memory device can further comprise one or more first magnetic pinning sites arranged in or on the first magnetic track between the first MTJ structure and the second MTJ structure; and/or one or more second magnetic pinning sites arranged in or on the second magnetic track between the third MTJ structure and the fourth MTJ structure.

Each respective magnetic track of the memory device may have one or more pinning sites for the magnetic domain, which may either be defined by designing a structural notch or a dent in the respective magnetic domain wall track, or may be defined by patterning an underlying substrate, or may be defined by selective ion irradiation to modulate the magnetic anisotropy, or may be defined by any other method feasible.

In an implementation, the memory device can comprise a set of magnetic domain wall tracks, the set including the first magnetic domain wall track and the second magnetic domain wall track, and each magnetic domain wall track comprising a respective strip of the patterned SOT generating layer and a respective magnetic strip of the patterned magnetic free layer, wherein the respective strip of the patterned SOT generating layer of each magnetic domain wall track extends along the second direction and intersects with the first strip in a respective crossing region, and the respective magnetic strip of each magnetic domain wall track is provided on the respective strip of the patterned SOT generating layer including the respective crossing region, and is configured to pass a respective current along the second direction; wherein the set of magnetic domain wall tracks includes 4 or 8 domain wall tracks.

In this way, a magnetic domain wall-based memory device can be provided, which can store a larger amount of data as bit states and/or may have an increased storage density.

The above first aspect and its implementations may refer to a "unit cell" of the memory device. For example, the memory device may comprise N magnetic domain wall tracks per unit cell that are crossing one SOT write track. N may be 4 or 8, or even more. The memory device may comprise more than one such unit cell, e.g., may comprise one or more additional SOT tracks and additional magnetic domain wall tracks crossing that additional SOT track.

A second aspect of the disclosed technology can provide a method of operating a magnetic domain wall-based memory device according to the first aspect or any of its implementations, the method comprising: passing the first current along the first strip; and setting a magnetization of the first magnetic strip between the first crossing region and the first MTJ structure by applying a first gate voltage or a second gate voltage to the first voltage gate, wherein the magnetization of the first magnetic strip between the first crossing region and the first MTJ structure switches, if the first gate voltage is applied to the first voltage gate, and does not switch, if the second gate voltage is applied to the first voltage gate.

In an implementation, the method can further comprise passing the second current along the first magnetic strip to transport a magnetization of the first magnetic strip between the first crossing region and the first MTJ structure by domain wall motion along the second direction towards the second MTJ structure.

In an implementation, the method can further comprise reading the magnetization of the first magnetic strip below the second MTJ structure by measuring a tunnel magnetoresistance of a tunnel current flowing between the first magnetic strip and the at least one magnetic reference layer or magnetic hard layer through the tunnel layer of the second MTJ structure.

In an implementation, the method can further comprise passing the first current along the first strip; and setting a magnetization of the second magnetic strip between the second crossing region and the third MTJ structure by applying a third gate voltage or a fourth gate voltage to the second voltage gate, wherein the magnetization of the second magnetic strip between the second crossing region and the third MTJ structure switches, if the third gate voltage is applied to the second voltage gate, and does not switch, if the fourth gate voltage is applied to the second voltage gate.

In an implementation, the method can further comprise passing the third current along the second magnetic strip to transport a magnetization of the second magnetic strip between the second crossing region and the third MTJ structure by domain wall motion along the second direction towards the fourth MTJ structure.

In an implementation, the method can further comprise reading the magnetization of the second magnetic strip below the fourth MTJ structure by measuring a tunnel magnetoresistance of a tunnel current flowing between the second magnetic strip and the at least one magnetic reference layer or magnetic hard layer through the tunnel layer of the fourth MTJ structure.

The methods of the second aspect can achieve the same advantages as described above for the memory devices of the first aspect and the implementations.

BRIEF DESCRIPTION OF THE DRAWINGS

The above described aspects and implementations are explained in the following description of embodiments with respect to the enclosed drawings:

FIGS. 1A-1, 1A-2, and 1A-3 show three different examples of a MRAM memory device, which combine TMR reading with either STT, SOT, or VCMA writing, respectively.

FIG. 1B shows a design of an example of a domain wall-based memory device, which uses an in-plane push current, TMR reading, and STT writing.

FIGS. 2A, 2B, and 2C show various views of an example magnetic domain wall-based memory device according to an embodiment of the disclosed technology.

FIGS. 3A, 3B, 3C, and 3D show an example working principle of a magnetic domain wall-based memory device according to an embodiment of the disclosed technology.

FIGS. 4A, 4B, and 4C show various views of an example magnetic domain wall-based memory device according to an embodiment of the disclosed technology.

FIGS. 5A, 5B, and 5C show an example layout of a magnetic domain wall-based memory device according to an embodiment of the disclosed technology.

DETAILED DESCRIPTION OF CERTAIN ILLUSTRATIVE EMBODIMENTS

Figure 6:
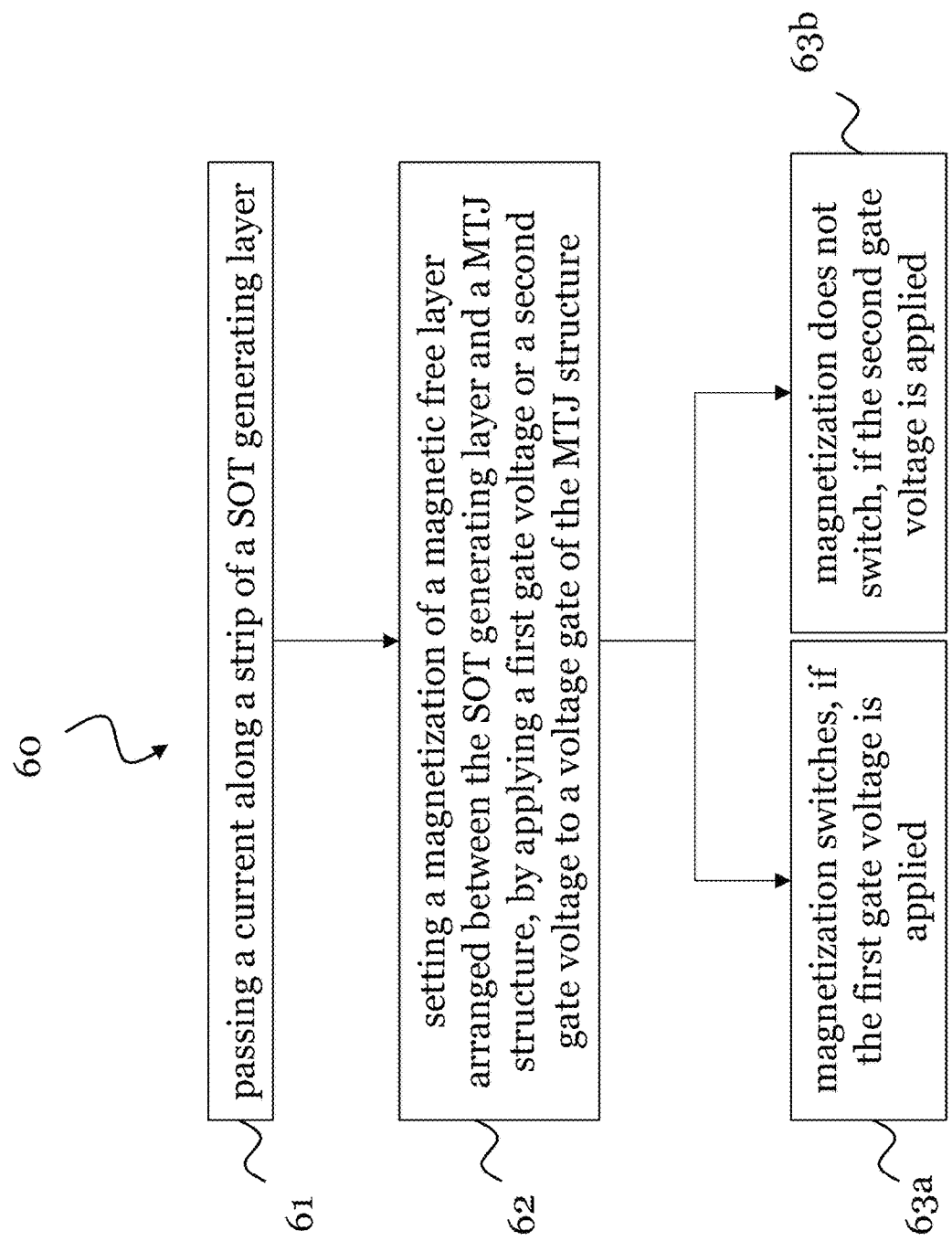
FIG. 6 shows an example method of operating a magnetic domain wall-based memory device, according to an embodiment of the disclosed technology.

FIGS. 2A-2C show various views of an example memory device 20 according to an embodiment of the disclosed technology, e.g., a magnetic domain wall-based memory device 20. The memory device 20 can be based on a combination of at least one magnetic domain wall track 23a and at least one SOT track 21, which are arranged in a track-crossing architecture. For example, the magnetic domain wall track 23a can cross the SOT track 21. The memory device 20 may be a MRAM device.

The memory device 20 can include the SOT track 21 (see FIG. 2A), wherein the SOT track 21 can comprise a first strip 22a of a patterned SOT generating layer (see FIG. 2C). The first strip 22a can extend into a first direction and can be configured to pass a first current along the first direction. Notably, FIG. 2A is a top-view of the memory device 20, and FIG. 2C is a cross-sectional view of the memory device 20 along the section A-A shown in FIG. 2A.

The memory device 20 can also include the magnetic domain wall track 23a (see FIG. 2A), wherein the first magnetic domain wall track 23a can comprise a second strip 22b of the patterned SOT generating layer, and a first magnetic strip 24a of a patterned magnetic free layer (see FIG. 2B). The second strip 22b can extend along a second direction and intersect with the first strip 22a in a first crossing region 25a (see FIG. 2A). Further, the first magnetic strip 24a can be provided on the second strip 22b including the first crossing region 25a (see FIG. 2B) and can be configured to pass a second current along the second direction. FIG. 2B is a cross-sectional view of the memory device 20 along the section B-B shown in FIG. 2A.

Further, the memory device 20 can comprise a first MTJ structure 26a and a second MTJ structure 26b, which can be both provided on the first magnetic strip 24a, and can be separated from each other in the second direction. The first MTJ structure 26a can be provided above the first crossing region 25a (see FIG. 2A, e.g., on the first magnetic strip 24a on the first crossing region 25a where the first strip 22a and the second strip 22b intersect), and can be provided with a first voltage gate 27a (see FIGS. 2B and 2C).

FIGS. 3A-3D show an example working principle of the magnetic domain wall-based memory device 20 shown in FIGS. 2A-2C, specifically, based on the cross-sectional view shown in FIG. 2B.

FIG. 3A shows an initial state of the memory device 20, wherein the first magnetic strip 24a of the free layer has certain magnetization above the first crossing region 25a, e.g., directly beneath the first MTJ structure 26a (indicated by the arrow).

FIG. 3B assumes that the first current flows along the first strip 22a. A first gate voltage VG1 is applied to the first voltage gate 27a of the first MTJ structure 26a, and as a consequence the magnetization of the first magnetic strip 24a above the first crossing region 25a and beneath the first MTJ structure 26a can switch (the arrow is shown flipped).

FIG. 3C assumes that the first current flows (e.g., still flowing) in the first strip 22a along the first direction, and that the second current I2 flows in the first magnetic strip 24a of the first domain wall track 23a along the second direction. As an example, the second gate voltage VG2 can be applied to the first voltage gate 27a of the first MTJ structure 26a, and as a consequence the magnetization of the first magnetic strip 24a above the first crossing region 25a and beneath the first MTJ structure 26a may not switch (e.g., can stay the same, as indicated by the arrow). As a further consequence, the magnetization of the first magnetic strip 24a previously set between the first crossing region 25a and the first MTJ structure 26a (as shown in FIG. 3B) can be transported by domain wall motion along the second direction towards the second MTJ structure 26b. For example, FIG. 3C shows that the magnetization can be transported by one unit of the first magnetic domain wall track 23a towards the second MTJ structure 26b.

FIG. 3D assumes that the first current flows (e.g., still flowing) along the first strip 22a, and the second current I2 flows (e.g., still flowing) along the second strip 22b. Now, as an example, the first gate voltage VG1 can again be applied to the first voltage gate 27a, and as a consequence the magnetization of the first magnetic strip 24a above the first crossing region 25a and beneath the first MTJ structure 26a can switch (arrow is flipped). As a further consequence, the magnetization of the first magnetic strip 24a previously set between the first crossing region 25a and the first MTJ structure 26a (for example, maintained, as shown in FIG. 3C) can be transported by domain wall motion along the second direction towards the second MTJ structure 26b. For example, FIG. 3D shows that this magnetization can be transported by one unit of the first magnetic domain wall track 23a towards the second MTJ structure 26b, while also the previously transported magnetization (as already set in FIG. 3C) is transported by one further unit.

FIGS. 4A-4C show an example memory device 20 according to an embodiment of the disclosed technology, which builds on the embodiment shown in FIGS. 3A-3D. Same elements of the memory devices 20 share the same reference signs and are implemented likewise.

The memory device 20 shown in FIGS. 4A-4C comprise a second magnetic domain wall track 23b (see FIG. 4A), which is arranged in parallel to the first magnetic domain wall track 23a. The second magnetic domain wall track 23b can comprise a third strip 22c of the patterned SOT generating layer and a second magnetic strip 24b of the patterned magnetic free layer (see FIG. 4B). Notably, FIG. 4B is a cross-sectional view of the memory device 20 along the section C-C shown in FIG. 4A. FIG. 4C shows the cross-sectional view along the section A-A.

The third strip 22c can extend along the second direction parallel to the second strip 22b, and can intersect with the first strip 22a in a second crossing region 25b (see FIG. 4A). The second magnetic strip 24b can be provided on the third strip 22c including the second crossing region 25b (see FIG. 4B), and can be configured to pass a third current along the second direction.

The memory device 20 also can comprise a third MTJ structure 26c and a fourth MTJ structure 26d, which can be both provided on the second magnetic strip 24b and can be separated from each other in the second direction (see FIG. 4B). The third MTJ structure 26c can be provided above the second crossing region 25b and can be provided with a second voltage gate 27b (see FIG. 4C). The third MTJ structure 26c and the first MTJ structure 26a can be separated from each other along the first direction above the first strip 22a.

The working principle of the second magnetic domain wall track 23b can be similar to the working principle of the first magnetic domain wall track 23a shown in FIGS. 3A-3D. For example, when the first current flows in the first strip 22a, a magnetization of the second magnetic strip 24b between the second crossing region 25b and the third MTJ structure 26c may be switched, if a third gate voltage is applied to the second voltage gate 27b, and may be not switched, if a fourth gate voltage is applied to the second voltage gate 27b. Further, when the third current flows in the second magnetic strip 24b along the second direction, the magnetization of the second magnetic strip 24b between the second crossing region 25b and the third MTJ structure 26c may be transported by domain wall motion along the second direction towards the fourth MTJ structure 26d.

FIGS. 5A-5C show another example memory device 20 according to an embodiment of the disclosed technology, which builds on the embodiment shown in FIGS. 4A-4C. Same elements of the memory devices 20 share the same reference signs and are implemented likewise. FIG. 5A shows the same top-view and cross-sectional views (FIGS. 5B and 5C) as shown in FIGS. 2A-2C.

As shown in FIGS. 5A-5C, the disclosed technology proposes a memory device architecture that can enable the VG-SOT switching mechanism (e.g., using the SOT track 21 to send the first in-plane current and using the voltage gates 27a, 27b to apply gate voltages) to switch efficiently the memory device 20 (e.g., the magnetizations in the magnetic free layer above the crossing regions 25a and 25b of respectively the strips 22a, 22b, and 22c of the SOT generating layer).

As can be seen in FIGS. 5A-5C, a concept of the disclosed technology can rely on an orthogonal arrangement of the magnetic domain wall tracks 23a, 23b on one axis (e.g., second direction), and the VG-SOT track 21 on the other axis (e.g., first direction). This can enable movement of domain walls along the magnetic domain wall tracks 23a, 23b, and detection of transported magnetic domain states by TMR below further MTJ structures arranged along the magnetic domain wall tracks 23a, 23b (e.g., the second MTJ structure 26b and the fourth MTJ structure 26d). The various magnetic domain wall tracks 23a, 23b may be provided on a substrate 51.

Writing of various bit states can be performed along the VG-SOT track by applying the first (SOT) current along the SOT track 21. Bit selectivity (e.g., since the SOT track 21 may be coupled to multiple MTJ structures including the first MTJ structure 26a and the third MTJ structure 26c) can be achieved using the VCMA effect on each of the MTJ structures 26a, 26c via gate voltages applied to the voltage gates 27a, 27b. The VCMA effect can reduce or increase the SOT current needed and can enable selectivity. It also can allow writing of multiple bits with a single (SOT)-current pulse, further reducing the power needs of the memory device 20.

In various implementations, the design of the memory device 20 is able to combine both serial operations via the magnetic domain wall tracks 23a, 23b with a parallel operation of VG-SOT writing and TMR reading using an SOT track 21. This can strongly increase the application space of the domain wall-based memory device 20, for example, for embedded memory applications with high bandwidth and low latency.

Notably, as shown in FIGS. 5A-5C, the memory device 20 may have more than one SOT track 21, e.g., an additional SOT track 21a. The second and fourth MTJ structure 26b, 26d may be arranged above the additional SOT track 21a. Here, the TMR read may be performed, e.g., when bit states are transported via domain wall motion from beneath the first MTJ structure 26a and the second MTJ structure 26b, respectively, along the first magnetic domain wall track 23a and the second magnetic domain wall track 23b. However, magnetic domain wall transport may also be performed in the other direction, e.g., from the second MTJ structure 26b to the first MTJ structure 26a along the first track 23a, and from the fourth MTJ structure 26d to the third MTJ structure 26c along the second track 23b. In this case VG-SOT write can be performed at the additional SOT track 21a and at the second and fourth MTJ structures 26b, 26d (e.g., equipped with voltage gates), and TMR read at the first and third MTJ structures 26a, 26c.

Optionally, as shown in FIG. 5A, specific pinning sites 52 may be defined on the specific magnetic domain wall tracks 23a, 23b for the magnetic domain. For instance, either by designing a structural notch/dent in the track 23a, 23b, or by patterning an underlying substrate 51, or by selective ion irradiation to modulate the magnetic anisotropy, or any other method deemed reasonable to create a repeatable pinning site for the magnetic domain.

Each MTJ structure 26a, 26b, 26c, 26d shown in the FIGS. 2-5 may comprise a tunnel layer, which may be a magnesium oxide (MgO) layer or MgO-based layer. An MgO resistance area product may range from 50-5000 $\Omega^*\mu m^2$. The tunnel layer can be provided on the respective strip 24a or 24b of the patterned magnetic free layer. Further, each MTJ structure may also include at least one magnetic reference layer or magnetic hard layer, which can be provided on the respective tunnel layer. The MTJ structures may be patterned down to the tunnel layer (e.g., MgO) in the direction of the magnetic domain wall tracks 23a, 23b, and/or may be patterned down to the SOT generating layer along the VG-SOT track 21.

Further, each magnetic domain wall track 23a, 23b and the SOT track 21 shown in the FIGS. 2-5 may, respectively, be provided with current leads to enable the passing of the first, second and third current, for example, to enable domain wall push along the magnetic domain wall tracks 23a, 23b, and to enable magnetic bit write above the SOT track 21.

Further, in each of the FIGS. 2-5, the patterned SOT generating layer may comprise at least one of a tantalum layer; tungsten layer, platinum layer, bismuth selenide layer, and bismuth antimonide layer. For example, the respective strips 22a, 22b, and 22c may be made from one or more of these materials. The SOT generating layer may have a thickness in a range of 2-10 nm. The patterned magnetic free layer in the FIGS. 1-4 may comprise at least one of an iron layer and a cobalt-based layer, for example, a cobalt layer, a cobalt-iron-boron layer, a cobalt-platinum layer, a cobalt-nickel layer, or a cobalt-palladium layer. For example, the respective magnetic strips 24a and 24b may be made from one or more of these materials. The magnetic free layer may be a hybrid or a synthetic antiferromagnetic (SAF)-hybrid free layer for magnetic conduit.

The memory device 20 may comprise more than one or two magnetic domain wall tracks 23a, 23b. For instance, the memory device 20 may comprise four or eight magnetic domain wall tracks, wherein each magnetic domain wall track can cross the SOT track 21 as described above, and can be formed in a similar manner as described for the first magnetic domain wall track 23a and the second magnetic domain wall track 23b.

FIG. 6 shows a flow-diagram of an example method 60 of operating a magnetic domain wall-based memory device 20, e.g., as shown in the FIGS. 2-5, according to an embodiment of the disclosed technology.

The method 60 can comprise passing the first current along the first strip 22a as shown in operational block 61. Further, as shown in operational block 62, the method can include setting a magnetization of the first magnetic strip 24a between the first crossing region 25a and the first MTJ structure 26a by applying a first gate voltage or a second gate voltage to the first voltage gate 27a. In various implementations, the magnetization of the first magnetic strip 24a between the first crossing region 25a and the first MTJ structure 26a can switch as shown in operational block 63a, if the first gate voltage is applied to the first voltage gate 27a. The magnetization may not switch as shown in operational block 63b, if the second gate voltage is applied to the first voltage gate 27a.

The method 60 may further comprise setting a magnetization of the second magnetic strip 24b between the second crossing region 25b and the third MTJ structure 26c by applying a third gate voltage or a fourth gate voltage to the second voltage gate 27b. In various implementations, the magnetization of the second magnetic strip 24b between the second crossing region 25b and the third MTJ structure 26c can switch, if the third gate voltage is applied to the second voltage gate 27b. The magnetization may not switch, if the fourth gate voltage is applied to the second voltage gate 27b.

The method 60 may further comprise passing the second and/or third current along the first and/or second magnetic strip 24a, 24b to transport a magnetization of the first and/or second magnetic strip 24a, 24b between the first and/or second crossing region 25a, 25b and the first and/or third MTJ structure 26a, 26c by domain wall motion along the second direction towards the second and/or fourth MTJ structure 26b, 26d.

The method 60 may also comprise reading the magnetization of the first and/or second magnetic strip 24a, 24b below the second and/or fourth MTJ structure 26b, 26d, by measuring a tunnel magnetoresistance of a tunnel current flowing between the first and/or second magnetic strip 24a, 24b and the at least one magnetic reference layer or magnetic hard layer through the tunnel layer of the respective second and/or fourth MTJ structure 26b, 26d.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above, the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A magnetic domain wall-based memory device comprising:
   a spin orbit torque (SOT) track comprising a first strip of a patterned SOT generating layer,
   wherein the first strip extends in a first direction and is configured to pass a first current along the first direction;
   a first magnetic domain wall track comprising a second strip of the patterned SOT generating layer and a first magnetic strip of a patterned magnetic free layer,
   wherein the second strip extends in a second direction and intersects with the first strip of the patterned SOT generating layer in a first crossing region, and the first magnetic strip is provided on the second strip including the first crossing region and is configured to pass a second current along the second direction;
   a second magnetic domain wall track comprising a third strip of the patterned SOT generating layer and a second magnetic strip of the patterned magnetic free layer,
   wherein the third strip extends along the second direction parallel to the second strip of the patterned SOT generating layer and intersects with the first strip of the patterned SOT generating layer in a second crossing region, and the second magnetic strip is provided on the third strip including the second crossing region and is configured to pass a third current along the second direction;
   a first magnetic tunnel junction (MTJ) structure and a second MTJ structure provided on the first magnetic strip and separated in the second direction,
   wherein the first MTJ structure is provided above the first crossing region and is provided with a first voltage gate; and
   a third MTJ structure and a fourth MTJ structure provided on the second magnetic strip and separated in the second direction,
   wherein the third MTJ structure is provided above the second crossing region and is provided with a second voltage gate.

2. The memory device according to claim 1, configured such that:
   when the first current flows in the first strip of the patterned SOT generating layer, a magnetization of the first magnetic strip between the first crossing region and the first MTJ structure switches if a first gate voltage is applied to the first voltage gate, and does not switch if a second gate voltage is applied to the first voltage gate.

3. The memory device according to claim 1, configured such that:
   when the second current flows in the first magnetic strip, a magnetization of the first magnetic strip between the first crossing region and the first MTJ structure is transported by domain wall motion along the second direction towards the second MTJ structure.

4. The memory device according to claim 1, configured such that:
   when the first current flows in the first strip of the patterned SOT generating layer, a magnetization of the second magnetic strip between the second crossing region and the third MTJ structure switches if a third gate voltage is applied to the second voltage gate, and does not switch if a fourth gate voltage is applied to the second voltage gate.

5. The memory device according to claim 1, configured such that:
   when the third current flows in the second magnetic strip, a magnetization of the second magnetic strip between the second crossing region and the third MTJ structure is transported by domain wall motion along the second direction towards the fourth MTJ structure.

6. The memory device according to claim 1, wherein the patterned SOT generating layer comprises at least one of a tantalum layer, a tungsten layer, a platinum layer, a bismuth selenide layer, and/or a bismuth antimonide layer.

7. The memory device according to claim 1, wherein the patterned magnetic free layer comprises at least one of an iron layer and/or a cobalt-based layer.

8. The memory device according to claim 7, wherein the patterned magnetic free layer comprises a cobalt layer, a cobalt-iron-boron layer, a cobalt-platinum layer, a cobalt-nickel layer, or a cobalt-palladium layer.

9. The memory device according to claim 1, wherein each MTJ structure comprises a tunnel layer provided on the patterned magnetic free layer, and at least one magnetic reference layer or magnetic hard layer provided on the tunnel layer.

10. The memory device according to claim 9, wherein the tunnel layer comprises a magnesium oxide layer.

11. The memory device according to claim 1, further comprising:
    one or more first magnetic pinning sites arranged in or on the first magnetic domain wall track between the first MTJ structure and the second MTJ structure; and/or
    one or more second magnetic pinning sites arranged in or on the second magnetic domain wall track between the third MTJ structure and the fourth MTJ structure.

12. The memory device according to claim 1, comprising:
    a set of magnetic domain wall tracks, the set including the first magnetic domain wall track and the second magnetic domain wall track, and each magnetic domain wall track comprising a respective strip of the patterned SOT generating layer and a respective magnetic strip of the patterned magnetic free layer,
    wherein the respective strip of the patterned SOT generating layer of each magnetic domain wall track extends along the second direction and intersects with the first strip of the patterned SOT generating layer in a respective crossing region, and the respective magnetic strip of each magnetic domain wall track is provided on the respective strip of the patterned SOT generating layer including the respective crossing region, and is configured to pass a respective current along the second direction, wherein the set of magnetic domain wall tracks includes 4 or 8 domain wall tracks.

13. A method of operating a magnetic domain wall-based memory device, the method comprising:

passing a first current along a first strip of a patterned spin orbit torque (SOT) generating layer;

setting a magnetization of a first magnetic strip between a first crossing region where the first strip of the patterned SOT generating layer intersects a second strip of the patterned SOT generating layer and a first magnetic tunnel junction (MTJ) structure by applying a first gate voltage or a second gate voltage to a first voltage gate, wherein upon application of the first gate voltage to the first voltage gate, switching of the magnetization of the first magnetic strip occurs, wherein upon application of the second gate voltage to the first voltage gate, no switching of the magnetization of the first magnetic strip occurs; and reading the magnetization of the first magnetic strip below a second MTJ structure by measuring a tunnel magnetoresistance of a tunnel current flowing between the first magnetic strip and at least one magnetic reference layer or magnetic hard layer through a tunnel layer of the second MTJ structure.

14. The method according to claim 13, further comprising:

passing a second current along the first magnetic strip to transport a magnetization of the first magnetic strip between the first crossing region and the first MTJ structure by domain wall motion along a second direction towards the second MTJ structure.

15. The method according to claim 13, further comprising:

setting a magnetization of a second magnetic strip between a second crossing region where the second strip of the patterned SOT generating layer intersects with a third strip of the patterned SOT generating layer and a third MTJ structure by applying a third gate voltage or a fourth gate voltage to a second voltage gate, wherein upon application of the third gate voltage to the second voltage gate, switching of the magnetization of the second magnetic strip occurs, and wherein upon application of the fourth gate voltage to the second voltage gate, no switching of the magnetization of the second magnetic strip occurs.

16. The method according to claim 15, further comprising:

passing a third current along the second magnetic strip to transport a magnetization of the second magnetic strip between the second crossing region and the third MTJ structure by domain wall motion along a second direction towards a fourth MTJ structure.

17. The method according to claim 16, further comprising:

reading the magnetization of the second magnetic strip below the fourth MTJ structure by measuring a tunnel magnetoresistance of a tunnel current flowing between the second magnetic strip and at least one magnetic reference layer or magnetic hard layer through a tunnel layer of the fourth MTJ structure.

18. A magnetic domain wall-based memory device comprising:

a spin orbit torque (SOT) track comprising a first strip of a patterned SOT generating layer, wherein the first strip extends in a first direction and is configured to pass a first current along the first direction;

a first magnetic domain wall track comprising a second strip of the patterned SOT generating layer and a first magnetic strip of a patterned magnetic free layer, wherein the second strip extends in a second direction and intersects with the first strip of the patterned SOT generating layer in a first crossing region, and the first magnetic strip is provided on the second strip including the first crossing region and is configured to pass a second current along the second direction;

a first magnetic tunnel junction (MTJ) structure and a second MTJ structure provided on the first magnetic strip and separated in the second direction, wherein the first MTJ structure is provided above the first crossing region and is provided with a first voltage gate;

one or more first magnetic pinning sites arranged in or on the first magnetic domain wall track between the first MTJ structure and the second MTJ structure; and/or one or more second magnetic pinning sites arranged in or on a second magnetic domain wall track between a third MTJ structure and a fourth MTJ structure.

19. The memory device according to claim 18, configured such that:

when the first current flows in the first strip of the patterned SOT generating layer, a magnetization of the first magnetic strip between the first crossing region and the first MTJ structure switches if a first gate voltage is applied to the first voltage gate, and does not switch if a second gate voltage is applied to the first voltage gate.

20. A method of operating a magnetic domain wall-based memory device, the method comprising:

passing a first current along a first strip of a patterned spin orbit torque (SOT) generating layer;

setting a magnetization of a first magnetic strip between a first crossing region where the first strip of the patterned SOT generating layer intersects a second strip of the patterned SOT generating layer and a first magnetic tunnel junction (MTJ) structure by applying a first gate voltage or a second gate voltage to a first voltage gate, wherein upon application of the first gate voltage to the first voltage gate, switching of the magnetization of the first magnetic strip occurs, wherein upon application of the second gate voltage to the first voltage gate, no switching of the magnetization of the first magnetic strip occurs; and setting a magnetization of a second magnetic strip between a second crossing region where the second strip of the patterned SOT generating layer intersects with a third strip of the patterned SOT generating layer and a third MTJ structure by applying a third gate voltage or a fourth gate voltage to a second voltage gate, wherein upon application of the third gate voltage to the second voltage gate, switching of the magnetization of the second magnetic strip occurs, wherein upon application of the fourth gate voltage to the second voltage gate, no switching of the magnetization of the second magnetic strip occurs.

* * * * *